United States Patent
Yu et al.

(10) Patent No.: US 6,646,885 B1
(45) Date of Patent: Nov. 11, 2003

(54) ENHANCED ELECTRONIC CARD STRUCTURE

(75) Inventors: Gordon Yu, Taipei (TW); Tsung-Kan Cheng, Taipei (TW); Forli Wen, Hsinchu (TW)

(73) Assignees: C-One Technology Corp., Hsin-Chu (TW); Pretec Electronics Corp., Fremont, CA (US)

( * ) Notice: Subject to any disclaimer, the term of this patent is extended or adjusted under 35 U.S.C. 154(b) by 0 days.

(21) Appl. No.: 10/357,223

(22) Filed: Feb. 4, 2003

(30) Foreign Application Priority Data

Oct. 3, 2002 (TW) ........................ 91215697 U

(51) Int. Cl.⁷ .................... H05K 5/02; G06K 19/18
(52) U.S. Cl. ................. 361/737; 361/736; 361/752; 235/492
(58) Field of Search ............... 361/728, 736, 361/737, 752, 760, 748; 235/490, 488, 492, 493; 174/250, 260; D14/435, 436

(56) References Cited

U.S. PATENT DOCUMENTS

| | | | | |
|---|---|---|---|---|
| 3,702,464 A | * | 11/1972 | Castrucci | 340/173 |
| 4,532,419 A | * | 7/1985 | Takeda | 235/492 |
| 4,794,243 A | * | 12/1988 | Hamada | 235/492 |
| D421,597 S | * | 3/2000 | Oba et al. | D13/182 |
| D445,797 S | * | 7/2001 | Lee et al. | D14/436 |
| D446,525 S | * | 8/2001 | Okamoto et al. | D14/436 |
| D452,243 S | * | 12/2001 | Wallace | D14/436 |
| 6,381,143 B1 | * | 4/2002 | Nakamura | 361/737 |
| D457,887 S | * | 5/2002 | Kadonaga | D14/436 |
| 6,433,285 B2 | * | 8/2002 | Maeda et al. | 174/260 |
| 6,483,038 B2 | * | 11/2002 | Lee et al. | 174/255 |
| D467,586 S | * | 12/2002 | Shimoda et al. | D14/436 |

* cited by examiner

*Primary Examiner*—David Martin
*Assistant Examiner*—Dameon E. Levi
(74) *Attorney, Agent, or Firm*—Bacon & Thomas, PLLC

(57) ABSTRACT

An enhanced electronic card structure includes a circuit board, a top cover board, and a bottom cover board. The circuit board has multiple front front and rear contact points. At least one fixing hole is defined between any two adjacent front contact points. The top cover board has a front edge defined therein multiple gaps, each aligned with one front contact point and corresponding rear contact point. Any two adjacent gaps are separated by a rib, each rib having a bottom face extended thereform a fixing tip aligned with the fixing hole. The bottom cover board has a surface formed thereon multiple fixing joints, each aligned with one fixing tip at the bottom of the rib, so as to make the fixing tip pass through the corresponding fixing hole to be fixed to the corresponding fixing joint.

9 Claims, 3 Drawing Sheets

ENHANCED ELECTRONIC CARD STRUCTURE

BACKGROUND OF THE INVENTION

1. Field of the Invention

The present invention relates to an electronic card, and especially to an enhanced electronic card structure with a high strength and capable of transferring data at a high speed and providing diversified functions.

2. Description of Related Art

With advances in electronic technology, various electronic devices, such as notebook computers, hand-held computers, PDAs (personal digital assistants), are getting smaller in size. These small-sized electronic devices provide convenience to the user due to their portability and data processing capability. However, because of the small size, such an electronic device generally has only basic processing circuitry. For other circuit modules, such as add-on memory, modem, network card, etc., have to be provided to the electronic device by inserting a corresponding electronic card therein. This electronic card can also be inserted into a personal computer for enabling data communications or increasing data storage space.

Because the dimension of the integrated circuit embedded in the aforementioned electronic card is miniaturized, the electronic card scale can be made small. However, on such a small-sized electronic card, the number of contact points to be electrically contacted with the terminals of a corresponding slot is hence limited. Besides, for making the contact points of the electronic card accurately and securely contact- with the corresponding slot terminals, the contact points are typically arranged at a front edge of the electronic card. As shown in FIG. 1, a SD memory card has a size of $24 \times 32 \times 2.1$ mm$^3$, and there are only 9 contact points 11 arranged on the front edge at the top surface of the card.

The above SD memory card has contact points 11 on the front edge of the card surface for providing the connections of power, data, address and control between the electronic card and a host device. However, providing connections for power, data, address and control with only 9 points 11 is inadequate, and thus the performance the card is restricted. For examples, the data transmission rate is low due to the insufficient number of data lines, or the memory space capable of being addresses is too small due to the inadequate number of address lines.

Furthermore, in order to prevent the forementioned closely arranged contact points from being accidentally touched, the front portion of the upper lid 12 of the SD memory card has multiple ribs 13 to separate every contact point 11 from each other. However, due to the small scale of the electronic card, the rib 13 is therefore subjected to be slim enough, which results in that the rib 13 is likely deformed or broken. In addition, if the number of contact points 11 is increased, the size of the rib 13 must be even smaller, and this will definitely weaken the strength of the rib 13. Therefore, it is desirable for the above conventional electronic card to be improved so as to mitigate and/or obviate the aforementioned problems.

SUMMARY OF THE INVENTION

The object of the present invention is to provide an enhanced electronic card structure with a high strength and capable of transferring data at a high speed and providing diversified functions To achieve the subject, the enhanced electronic card structure in accordance with the present invention includes: a circuit board having a surface, and multiple front and rear contact points arranged at a front edge of the surface, wherein any one of the rear contact points is arranged at the back of a front contact point, and at least one fixing hole is defined between any two adjacent front contact points; a top cover board arranged on top of the circuit board, and having a front edge defined therein multiple gaps, each gap being aligned with one front contact point and corresponding rear contact point, any two adjacent gaps being separated by a rib, each rib having a bottom face extended thereform at least one fixing tip which is aligned with the at least one fixing hole; and a bottom cover board arranged below the circuit board, and having a surface arranged thereon multiple fixing joints, each fixing joint being aligned with one fixing tip at the bottom of the rib of the top cover board, so as to make the fixing tip pass through the corresponding fixing hole to be fixed to the corresponding fixing joint.

Other objects, advantages, and novel features of the invention will become more apparent from the detailed description when taken in conjunction with the accompanying drawings.

DETAILED DESCRIPTION OF THE PREFERRED EMBODIMENTS

Figure 2:
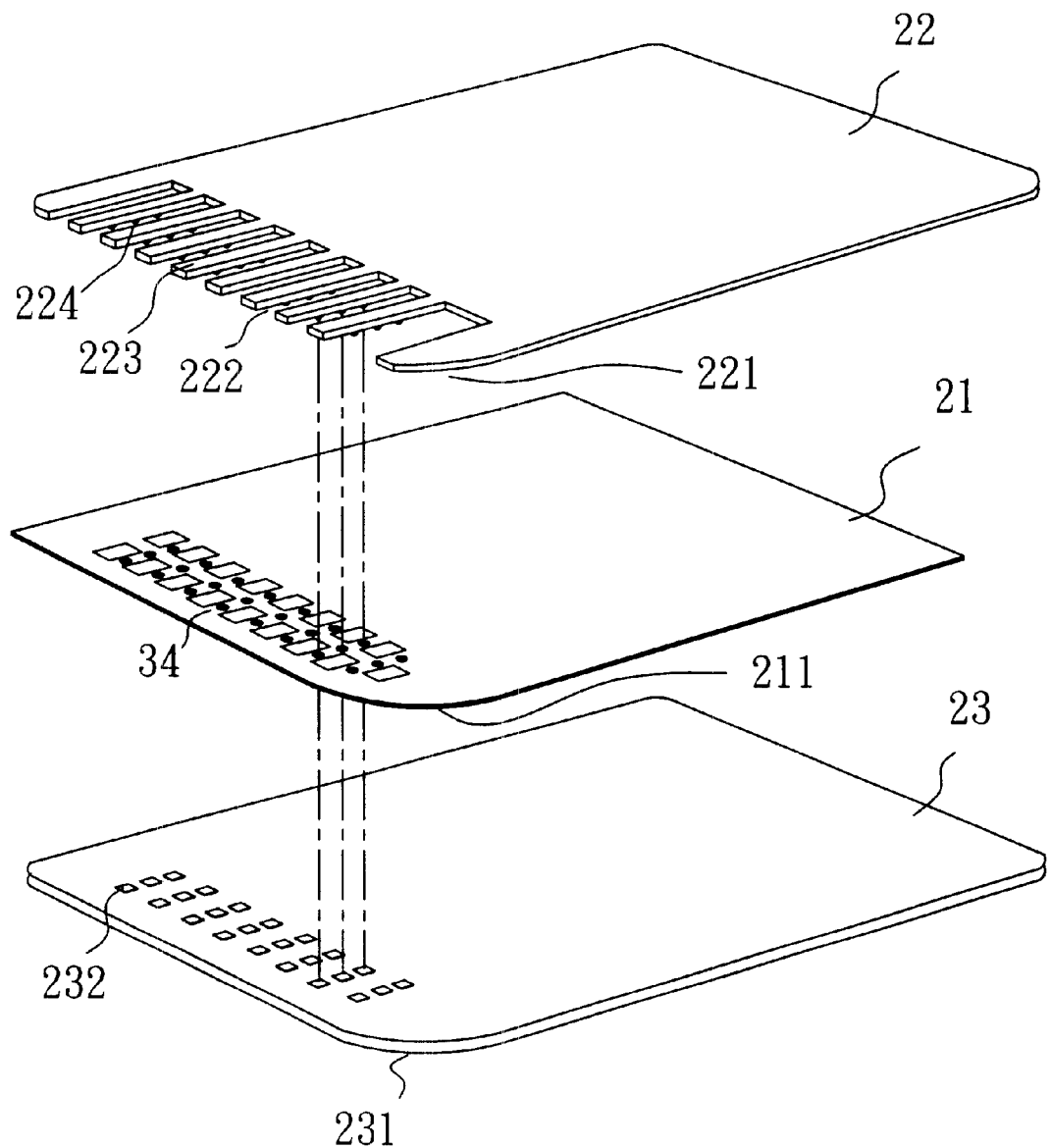
FIG. 2 is an exploded view of the enhanced electronic card structure in accordance with the present invention.

With reference to FIG. 2, there is an exploded view of an enhanced electronic card structure in accordance with a preferred embodiment of the present invention, which comprises a circuit board 21, a top cover board 22 and a bottom cover board 23. Within such a structure, the top cover board 22 has a circular angle 221 at the front edge and the bottom cover board 23 also has a circular angle 231 at the front edge. The circuit board 21 is arranged between the top cover board 22 and the bottom cover board 23. The top cover board 22 and the bottom cover board 23 are bonded together by ultrasound smelting or plastic injection to form a shell for encapsulating the circuit board 21.

Figure 3:
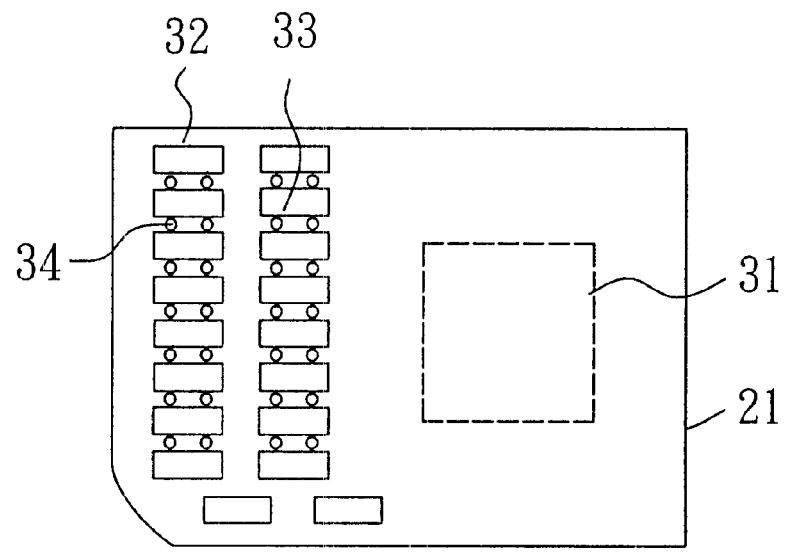
FIG. 3 is the front view of the circuit board in accordance with the enhanced electronic card structure of the present invention.

FIG. 3 shows the front view of the circuit board 21, which is a multi-layer circuit board with a cutoff 211 at the front edge. The functional circuit module 31 of the electronic card 21 is arranged in the inner layer of the circuit board 21. The top front edge of the circuit board 21 has multiple front contact points 32 and multiple rear contact points 33, wherein any one of the rear contact points 33 is arranged in the back of one front contact point 32, and there is defined at least one fixing hole 34 in between one set of front and rear contact points 32, 33 and the adjacent set of front and rear contact points 32, 33.

The front contact points 32 and the rear contact points 34 are electrically connected to the functional circuit module 31 through the inner layer circuit connections. Therefore, when plugging this electronic card into a slot of a host device (not shown), the function circuit module 31 is electrically connected to the host device. Any one of the front contact points 32 and its corresponding rear contact point 33 must be separated by a predetermined distance. Thus, when pulling out the electronic card, no short circuit is encountered due to the front contact point 32 and the corresponding rear contact point 33 sequentially touching the slot terminals of the host device.

With reference to FIG. 2 again, there are multiple gaps 222 defined at the front edge of the top cover board 222. Each gap 222 is aligned with one of the front contact points 32 of the circuit board 21 and its corresponding rear contact point 33, and any two adjacent gaps 222 are divided by a rib 223. At the bottom face of each rib 223, at least one fixing tip 224 is extended and aligned with at least one fixing hole 34. The surface of the bottom cover board 23 has multiple fixing joints 232 in the front edge. Each fixing joint 232 is aligned with one fixing tip 224 at the bottom face of the rib 223 of the top cover board 22, so as to make the fixing tips 224 pass through the corresponding fixing holes 34 in the circuit board 21 to be fixed to the corresponding fixing joints 232 by using ultrasound smelting techniques or the like.

Figure 4:
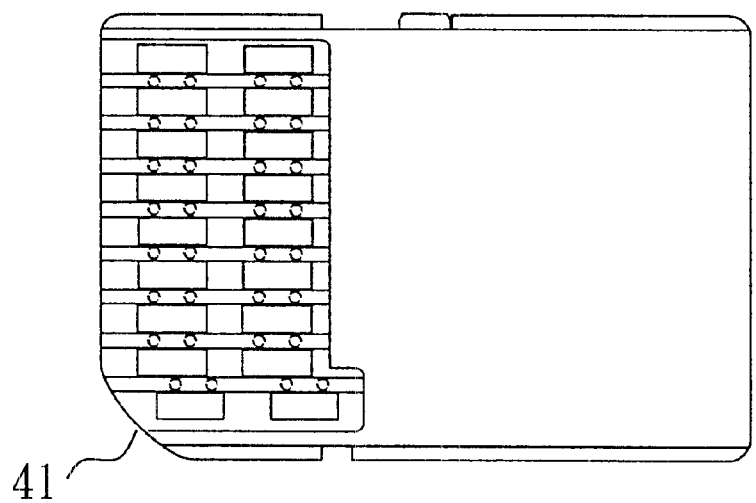
FIG. 4 is the front view of the enhanced electronic card structure in accordance with the present invention.

FIG. 4 is the front view diagram of the enhanced electronic card after being assembled. As shown, the gaps 221 of the top cover board 22 exposes the front contact points 32 and the rear contact points 33 of the circuit board 21. The circular angle 221 of the top cover board 22, the cutoff 211 of the circuit board 21 and the circular angle 231 of the bottom cover board 23 together form a circular angle 41 of the electronic card to provide the function for preventing an erroneous plugging.

Figure 1:
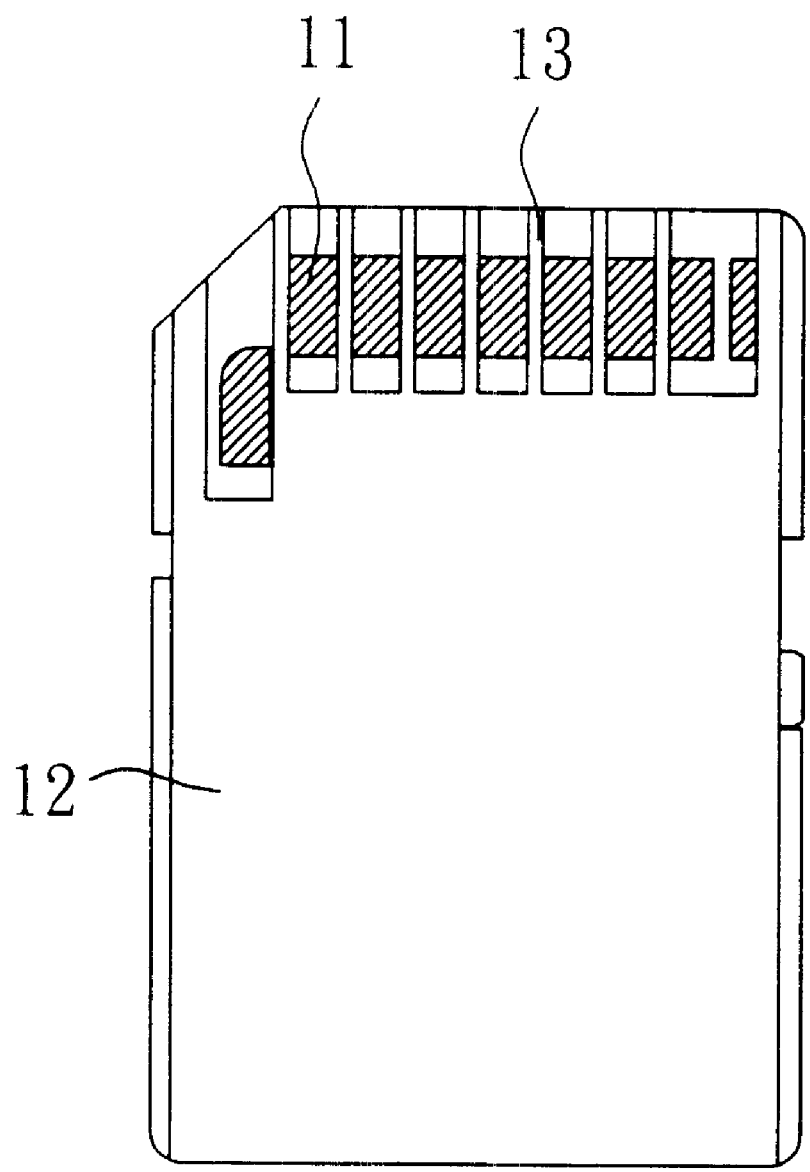
FIG. 1 illustrates the arrangement of the contact points on a SD Memory card.

According to the present enhanced electronic card structure, the two rows of contact points 32, 32 are employed to provide an adequate number of contact points for enhancing the performance of the electronic card. For example, the front contact points 32 are used to provide the connections of standard power, data bus, address bus and control bus, and the rear contact points 33 are used to provide the connections of extended data bus. Therefore, the number of data lines can be increased so as to greatly enhance the data transmission rate. Alternatively, the rear contact points 33 can be used to provide various I/O functions. In this preferred embodiment, the electronics card has nine front contact points 32 and eight rear contact points 33, wherein the definition of the front contact points 32 is the same as that of the contact points 11 of the SD Memory card shown in FIG. 1. Hence, the electronic card of the preferred embodiment is compatible with the SD Memory card. Accordingly, the present electronic card not only can be plugged in a corresponding host device but also can be plugged in a standard SD Memory card slot. Moreover, the ribs 223 become longer because of the arrangement of the two rows of contact points 32, 32. However, the ribs 223 on the top cover board 22 are passed through the fixing holes 34 of the circuit board 21 by extending the fixing tips 224 to be fixed to the bottom cover board 23, so as to not only enhance the strength of ribs 223, but also strengthen the hardness of the whole electronic card. In addition, the present electronic card can also be designed to have ten front contact points 32 and nine rear contact points 33, wherein the definition of the front contact points 32 is the same as that of the contact points of a standard Memory Stick card, and the rear contact points 33 are used to provide the extended data bus or I/O functions, thereby making the electronic card compatible with the Memory Stick card. Accordingly, the present electronic card not only can be plugged in a corresponding host device but also can be plugged in a standard Memory Stick card slot.

Although the present invention has been explained in relation to its preferred embodiments, it is to be understood that many other possible modifications and variations can be made without departing from the spirit and scope of the invention as hereinafter claimed.

What is claimed is:

1. An enhanced electronic card structure comprising:

a circuit board having a surface, and multiple front and rear contact points arranged at a front edge of the surface, wherein any one of the rear contact points is arranged at the back of a front contact point, and at least one fixing hole is defined between any two adjacent front contact points;

a top cover board arranged on top of the circuit board, and having a front edge defined therein multiple gaps, each gap being aligned with one front contact point and corresponding rear contact point, any two adjacent gaps being separated by a rib, each rib having a bottom face extended therefrom at least one fixing tip which is aligned with the at least one fixing hole; and a bottom cover board arranged below the circuit board, and having a surface formed thereon multiple fixing joints, each fixing joint being aligned with one fixing tip at the bottom of the rib of the top cover board, so as to make the fixing tip pass through the corresponding fixing hole to be fixed to the corresponding fixing joint.

2. The enhanced electronic card structure as claimed in claim 1, wherein one front contact point and its corresponding rear contact point are separated by a predetermined distance.

3. The enhanced electronic card structure as claimed in claim 1, wherein two circular angles are provided on the same front edge of the top cover board and the bottom cover board.

4. The enhanced electronic card structure as claimed in claim 3, wherein the circuit board has a cutoff at a position corresponding to the circular angles of the top cover board and the bottom cover board.

5. The enhanced electronic card structure as claimed in claim 2, wherein the front contact points provide standard power, data, address and control connections, and the rear contact points provide extended data connections.

6. The enhanced electronic card structure as claimed in claim 2, wherein the front contact points provide standard power, data, address and control connections, and the rear contact points provide I/O functions.

7. The enhanced electronic card structure as claimed in claim 6, wherein the circuit board has nine front contact points which are defined to be the same as the contact points of a standard SD Memory card.

8. The enhanced electronic card structure as claimed in claim 6, wherein the circuit board has ten front contact points which are defined to be the same as the contact joins of a standard Memory Stick card.

9. The enhanced electronic card structure as claimed in claim 1, wherein the top cover board and the bottom cover board are bonded together to form a shell for packing the circuit board by using the techniques of ultrasound smelting or plastic material injection.

* * * * *